United States Patent
Chen et al.

(10) Patent No.: US 11,476,173 B2
(45) Date of Patent: Oct. 18, 2022

(54) MANUFACTURING METHOD OF INTEGRATED CIRCUIT PACKAGING STRUCTURE

(71) Applicant: Yangtze Memory Technologies Co., Ltd., Wuhan (CN)

(72) Inventors: Peng Chen, Wuhan (CN); Houde Zhou, Wuhan (CN); BaoHua Zhang, Wuhan (CN); Chao Gu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 19 days.

(21) Appl. No.: 16/923,075

(22) Filed: Jul. 7, 2020

(65) Prior Publication Data
US 2020/0335410 A1    Oct. 22, 2020

Related U.S. Application Data

(63) Continuation of application No. 16/294,951, filed on Mar. 7, 2019, now abandoned, which is a
(Continued)

(51) Int. Cl.
*H01L 23/31* (2006.01)
*H01L 21/56* (2006.01)
(Continued)

(52) U.S. Cl.
CPC .......... *H01L 23/3121* (2013.01); *H01L 21/56* (2013.01); *H01L 23/367* (2013.01);
(Continued)

(58) Field of Classification Search
CPC ... H01L 23/36; H01L 23/367; H01L 23/3672; H01L 23/3677; H01L 23/373; H01L 23/3736; H01L 23/3735
See application file for complete search history.

(56) References Cited

U.S. PATENT DOCUMENTS 5,883,430 A     3/1999  Johnson
6,265,771 B1 *  7/2001  Ference .............. H01L 25/0657
                                              257/676
(Continued)

FOREIGN PATENT DOCUMENTS

CN        2596547 Y    12/2003
CN        1494136 A     5/2004
(Continued)

*Primary Examiner* — David A Zarneke
(74) *Attorney, Agent, or Firm* — Winston Hsu (57) ABSTRACT

A manufacturing method of an integrated circuit (IC) packaging structure includes the following steps. One or a plurality of dies is disposed on a packaging substrate. An encapsulation material is formed on the packaging substrate. The encapsulation material is configured to encapsulate the one or the plurality of the dies on the packaging substrate. At least one trench is formed in the encapsulation material. A heat dissipation structure is formed on the encapsulation material, and at least a part of the heat dissipation structure is formed in the at least one trench. The step of forming the heat dissipation structure includes the following steps. A first slurry is formed in the at least one trench, and a first curing process is performed to the first slurry for forming a first portion of the heat dissipation structure.

20 Claims, 10 Drawing Sheets

Related U.S. Application Data continuation of application No. PCT/CN2019/072669, filed on Jan. 22, 2019.

(51) Int. Cl.
*H01L 23/367* (2006.01)
*H01L 23/373* (2006.01)

(52) U.S. Cl.
CPC ...... *H01L 23/3672* (2013.01); *H01L 23/3677* (2013.01); *H01L 23/373* (2013.01); *H01L 23/3735* (2013.01); *H01L 23/3736* (2013.01)

(56) References Cited

U.S. PATENT DOCUMENTS

| | | | | |
|---|---|---|---|---|
| 6,369,455 B1* | 4/2002 | Ho | ...................... | H01L 23/4334 257/730 |
| 6,469,380 B2 | 10/2002 | Sorimachi | | |
| 6,924,559 B2* | 8/2005 | Guiragossian | .......... | H01L 23/36 257/678 |
| 7,045,395 B2* | 5/2006 | Lo | .......................... | H01L 21/561 257/E23.092 |
| 7,196,403 B2* | 3/2007 | Karim | ............... | H01L 23/49816 257/E23.092 |
| 7,361,986 B2* | 4/2008 | Yuan | ................... | H01L 23/4334 257/713 |
| 7,378,300 B2* | 5/2008 | Marimuthu | ............. | H01L 24/97 257/E23.116 |
| 7,875,970 B2* | 1/2011 | Li | ...................... | H01L 23/4334 257/706 |
| 7,964,951 B2* | 6/2011 | Refai-Ahmed | ......... | H01L 23/10 257/777 |
| 8,058,736 B2 | 11/2011 | Koike | | |
| 8,581,374 B1 | 11/2013 | Chen | | |
| 8,810,021 B2* | 8/2014 | Nakashiba | .......... | H01L 23/3128 257/691 |
| 8,836,110 B2* | 9/2014 | Chopin | ............... | H01L 23/4334 165/185 |
| 8,994,161 B2* | 3/2015 | Ahr | ......................... | H01L 24/97 257/676 |
| 9,059,143 B2* | 6/2015 | Imaizumi | ............ | H01L 25/0657 |
| 10,002,857 B2* | 6/2018 | Solimando | .............. | H01L 21/54 |
| 10,879,225 B2* | 12/2020 | Kim | .................... | H01L 23/4334 |
| 10,964,618 B2* | 3/2021 | Lee | ....................... | H01L 23/3738 |
| 2004/0037043 A1* | 2/2004 | Ku | ....................... | H01L 23/4334 257/E23.092 |
| 2007/0132091 A1 | 6/2007 | Wu | | |
| 2007/0181997 A1 | 8/2007 | Ahr | | |
| 2013/0307128 A1 | 11/2013 | Lin | | |
| 2015/0108625 A1 | 4/2015 | Ge | | |
| 2015/0348863 A1 | 12/2015 | Du | | |
| 2017/0358511 A1 | 12/2017 | Costa | | |

FOREIGN PATENT DOCUMENTS

| | | |
|---|---|---|
| CN | 101292348 A | 10/2008 |
| CN | 106384730 A | 2/2017 |
| CN | 106601691 A | 4/2017 |
| CN | 207124188 U | 3/2018 |
| CN | 108615819 A | 10/2018 |
| JP | 6-97326 | 4/1994 |
| JP | 2003-249512 | 9/2003 |
| JP | 2016-46476 | 4/2016 |
| TW | 388976 | 5/2000 |
| TW | I253731 | 4/2006 |
| TW | 200810040 | 2/2008 |
| TW | 201405893 A | 2/2014 |

\* cited by examiner

MANUFACTURING METHOD OF INTEGRATED CIRCUIT PACKAGING STRUCTURE

CROSS REFERENCE TO RELATED APPLICATIONS

This application is a continuation of application Ser. No. 16/294,951 filed on Mar. 7, 2019, which is a continuation of International Application No. PCT/CN2019/072669 filed on Jan. 22, 2019 and incorporated by reference herein in its entirety.

BACKGROUND OF THE INVENTION

1. Field of the Invention

The present disclosure relates to an integrated circuit (IC) packaging structure and a manufacturing method of an integrated circuit (IC) packaging structure, and more particularly, to a manufacturing method of an IC packaging structure including a heat dissipation structure.

2. Description of the Prior Art

In semiconductor manufacturing processes, an integrated circuit (IC) package is a step configured to encapsulate one or more semiconductor dies of integrated circuits with a molding compound for keeping the semiconductor dies from being damaged by external factors. Generally, a heat sink is disposed above the molding compound for heat dissipation. However, the heat dissipation performance is limited because the heat transfer coefficient of the molding compound is too low, and the total size of the IC package will be increased significantly by the heat sink especially when a higher cooling capability is demanded.

SUMMARY OF THE INVENTION

A manufacturing method of an integrated circuit (IC) packaging structure is provided in the present disclosure. A trench is formed in an encapsulation material, and a heat dissipation structure is at least partially disposed in the trench for reducing the distance between the heat dissipation structure and a die encapsulated by the encapsulation material. The cooling capability of the IC packaging structure may be improved accordingly without increasing the size of the IC packaging structure significantly.

According to an embodiment of the present disclosure, a manufacturing method of an IC packaging structure is provided. The manufacturing method includes the following steps. One or a plurality of dies is disposed on a packaging substrate. An encapsulation material is formed on the packaging substrate. The encapsulation material is configured to encapsulate the one or the plurality of the dies on the packaging substrate. At least one trench is formed in the encapsulation material. A heat dissipation structure is formed on the encapsulation material, and at least a part of the heat dissipation structure is formed in the at least one trench. The step of forming the heat dissipation structure includes the following steps. A first slurry is formed in the at least one trench. A first curing process is performed to the first slurry for forming a first portion of the heat dissipation structure.

In some embodiments, the step of forming the heat dissipation structure further includes forming a second slurry on a surface of the encapsulation material after forming the first slurry in the at least one trench.

In some embodiments, the step of forming the heat dissipation structure further includes performing a second curing process to the second slurry for forming a second portion of the heat dissipation structure on the surface of the encapsulation material, wherein the second slurry is formed after the first curing process.

In some embodiments, the second slurry is formed before the first curing process, and the second slurry is cured by the first curing process to be a second portion of the heat dissipation structure on the surface of the encapsulation material.

In some embodiments, a material composition of the second slurry is identical to a material composition of the first slurry.

In some embodiments, a material composition of the second slurry is different from a material composition of the first slurry.

In some embodiments, the first slurry comprises first metal particles, the second slurry comprises second metal particles, and a dimension of each of the second metal particles is larger than a dimension of each of the first metal particles.

In some embodiments, the manufacturing method further includes performing a cutting process after the step of forming the heat dissipation structure.

In some embodiments, the manufacturing method further includes performing a cutting process after the step of forming the encapsulation material and before the step of forming the at least one trench.

In some embodiments, a heat transfer coefficient of the heat dissipation structure is higher than a heat transfer coefficient of the encapsulation material.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
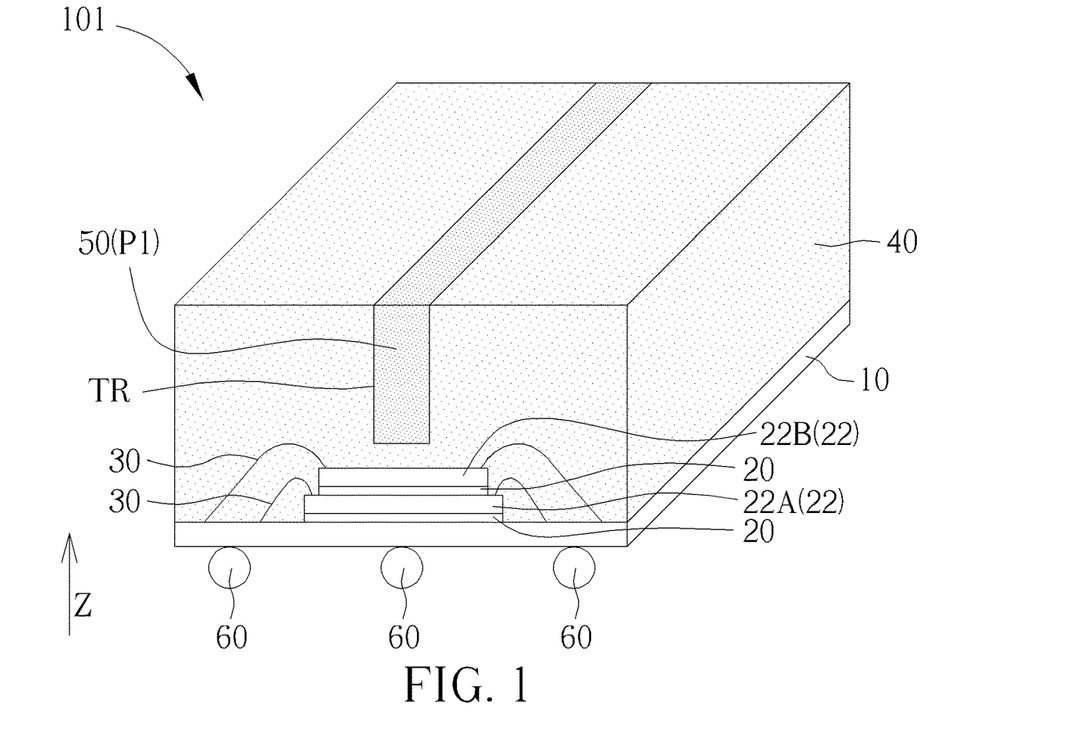
FIG. 1 is a schematic drawing illustrating an integrated circuit (IC) packaging structure according to a first embodiment of the present disclosure.

Please refer to FIG. 1. FIG. 1 is a schematic drawing illustrating an integrated circuit (IC) packaging structure according to a first embodiment of the present disclosure. As shown in FIG. 1, an IC packaging structure 101 includes a packaging substrate 10, one or a plurality of dies 22 disposed on the packaging substrate 10, an encapsulation material 40, at least one trench TR, and a heat dissipation structure 50. The encapsulation material 40 is disposed on the packaging substrate 10 and configured to encapsulate the one or the plurality of the dies 22 on the packaging substrate 10. It should be noted that the figures in the present disclosure are simplified schematic drawings for illustrative purposes, and the dies 22 are fully covered and encapsulated by the encapsulation material 40 actually. The at least one trench TR is disposed in the encapsulation material 40. At least a part of the heat dissipation structure 50 is disposed in the at least one trench TR. The cooling capability of the IC packaging structure 101 may be improved by the heat dissipation structure 50 because the heat dissipation structure 50 becomes closer to the dies 22 by being disposed in the trench TR within the encapsulation material 40, and the size of the IC packaging structure will not be increased by the heat dissipation structure 50.

The heat dissipation structure 50 in the present disclosure may be applied in different types of IC packaging technology, such as a ball grid array (BGA) package, a quad flat package (QFP), a quad flat no-leads (QFN) package, a land grid array (LGA) package, a pin grid array (PGA) package, or other suitable IC packaging technology. In some embodiments, the packaging substrate 10 may be formed by suitable insulating materials and/or dielectric materials. For example, the packaging substrate 10 may include a plastic substrate, such as an epoxy substrate, a bismaleimide triazine (BT) resin substrate, or a substrate made of other suitable materials capable of providing physical support to the dies 22. In some embodiments, the packaging substrate 10 may include multiple layers of conductive wires (not shown) disposed in the insulating material, and different layers of the conductive wires may be connected with one another by a connection via in the packaging substrate 10. In some embodiments, the dies 22 may be disposed on a first surface of the packaging substrate 10, a plurality of connection structures 60 (such as solder balls in BGA package) may be disposed on a second surface of the packaging substrate 10, and the second surface may be opposite to the first surface in a vertical direction Z. The vertical direction Z may be regarded as a thickness direction of the packaging substrate 10, but not limited thereto. In some embodiments, each of the dies 22 may be electrically connected to the packaging substrate 10 by a bonding wire 30 (such as an aluminum wire, a copper wire, a silver wire, or a gold wire), and the dies 22 may be electrically connected to the connection structures 60 via the bonding wires 30 and the packaging substrate 10, but not limited thereto.

Each of the dies 22 may be a die for any suitable purposes. In some embodiments, each of the dies 22 may be an IC die including circuits for date storage, compute, and/or processing. Some of the dies 22 may be stacked in the vertical direction Z. For example, a second die 22B may be disposed on a first die 22A in the vertical direction Z. In some embodiments, the second die 22B may be smaller than the first die 22A for providing a required bonding area on the first die 22A, but not limited thereto. In some embodiments, the dimensions of the dies 22 stacked in the vertical direction Z may be substantially equal to one another, and the dies 22 may be shifted respectively in a horizontal direction perpendicular to the vertical direction Z for providing a required bonding area on each die 22. In some embodiments, medium layers 20 may be disposed between the die 22 and the packaging substrate 10 and/or between the dies 22, and each of the medium layers 20 may be an adhesive film, a polymer film, and/or a spacer film.

The encapsulation material 40 may include a plastic material, such as an epoxy molding compound (EMC), or other suitable insulation materials. In some embodiments, a heat transfer coefficient of the heat dissipation structure 50 may be higher than a heat transfer coefficient of the encapsulation material 40. For example, the heat dissipation structure 50 may include metal, such as silver, or other suitable materials having respectively higher heat transfer coefficient. The thermal conductivity of silver is about 429 W/(m·K), and the thermal conductivity of EMC is about 0.8 W/(m·K). The heat dissipation structure 50 in this embodiment may be regarded as a heat dissipation structure embedded in the encapsulation material 40 for providing a better heat transfer path from the dies 22 to the surface of the IC packaging structure 101. A part of the encapsulation material 40 is still located between the heat dissipation structure 50 and the dies 22 in the vertical direction Z. In other words, the trench TR does not penetrate the encapsulation material 40 above the dies 22, and the heat dissipation structure 50 may be isolated from the one or the plurality of the dies 22 by the encapsulation material 40. In some embodiments, the heat dissipation structure 50 may be disposed corresponding to at least one of the dies 22 in the vertical direction Z, but not limited thereto. The location of the heat dissipation structure 50 and/or the depth of the trench TR may be further modified according to the heat distribution on the stacked dies 22 and/or the circuits in the packaging substrate 10.

As shown in FIG. 1, a manufacturing method of the IC packaging structure 101 may include the following steps. One or a plurality of dies 22 is disposed on the packaging substrate 10. The encapsulation material 40 is formed on the packaging substrate 10. The encapsulation material 40 is configured to encapsulate the one or the plurality of the dies 22 on the packaging substrate 10. At least one trench TR is formed in the encapsulation material 40. A heat dissipation structure 50 is formed on the encapsulation material 40, and at least a part of the heat dissipation structure 50 is formed in the at least one trench TR.

Figure 2:
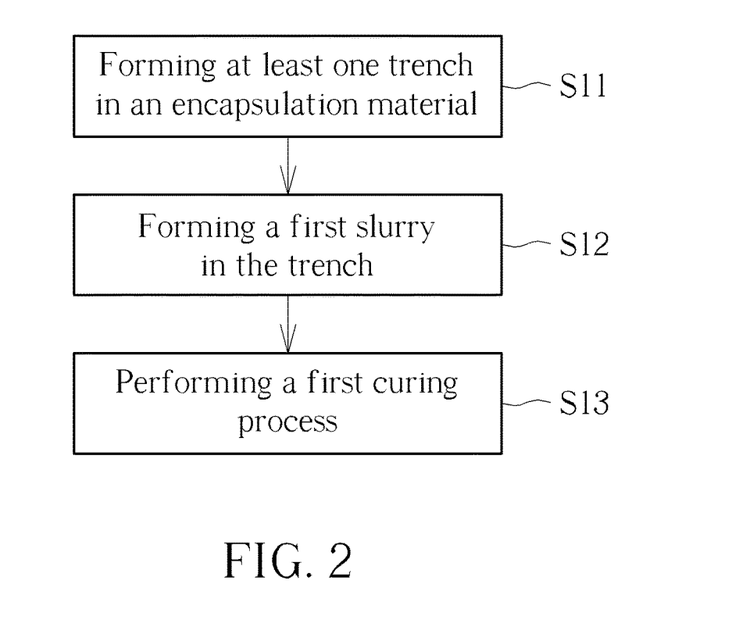
FIG. 2 is a flowchart of a manufacturing method of the IC packaging structure shown in FIG. 1 according to an embodiment of the present disclosure.

Please refer to FIG. 2 and FIG. 1. FIG. 2 is a flowchart of a manufacturing method of the IC packaging structure 101 in FIG. 1 according to an embodiment of the present disclosure. As shown in FIG. 2 and FIG. 1, the method of forming the heat dissipation structure 50 may include but is not limited to the following steps. In step S11, the at least one trench TR is formed in the encapsulation material 40. The trench TR may be formed by a laser engraving process, an etching process, or other suitable approaches. In step S12, a first slurry P1 may be formed in the at least one trench TR. The first slurry P1 may include metal, metallic compounds, adhesives, dispersing agents, solvents, or other suitable components. In some embodiments, the first slurry P1 may be a sliver slurry including silver particles, but not limited thereto. Subsequently, in step S13, a first curing process is performed to the first slurry P1 for forming the heat dissipation structure 50 in the trench TR. In some embodiments, the first curing process may include a thermal curing process, an irradiation curing process, or other suitable curing approaches according to the curing requirements of the first slurry P1. The first slurry P1 may be cured and solidified to be the heat dissipation structure 50 located in the trench TR. It is worth noting that the method of forming the heat dissipation structure 50 is not limited to the steps described above. In some embodiments, the heat dissipation structure 50 may be formed by other suitable approaches performed outside the trench TR (e.g. metal injection molding) and be placed in the trench TR subsequently.

The cooling capability of the IC packaging structure 101 may be improved without increasing the size of the IC packaging structure 101 because the heat dissipation structure 50 is disposed in the trench TR within the encapsulation material 40 and the heat dissipation structure 50 with a higher heat transfer coefficient becomes closer to the dies 22 on the packaging substrate 10.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 3:
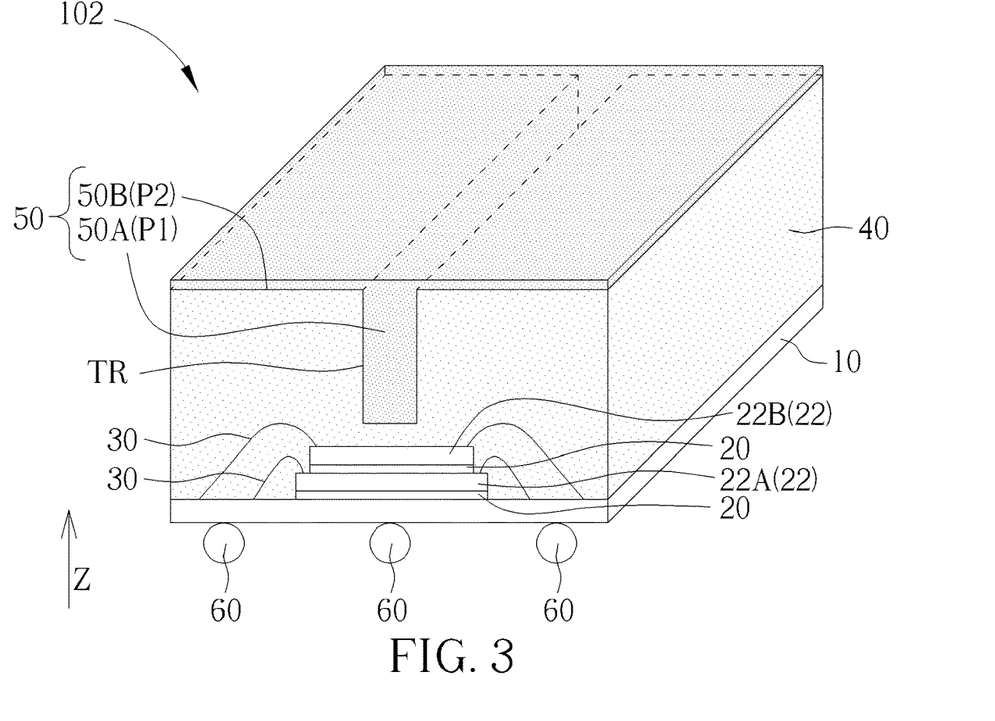
FIG. 3 is a schematic drawing illustrating an IC packaging structure according to a second embodiment of the present disclosure.
Figure 4:
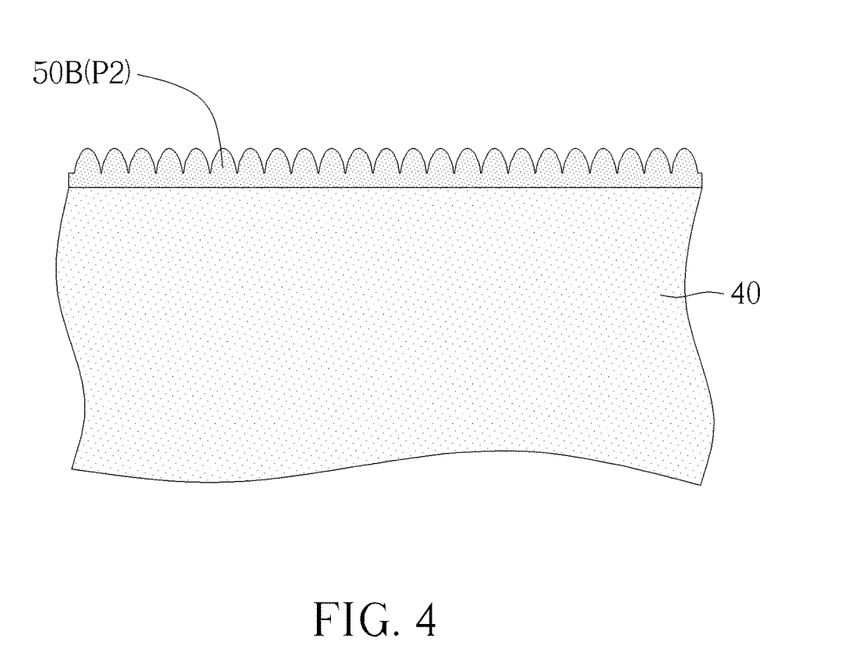
FIG. 4 is a schematic drawing illustrating a second portion of a heat dissipation structure in the IC packaging structure according to the second embodiment of the present disclosure.

Please refer to FIG. 3 and FIG. 4. FIG. 3 is a schematic drawing illustrating an IC packaging structure 102 according to a second embodiment of the present disclosure. FIG. 4 is a schematic drawing illustrating a second portion 50B of the heat dissipation structure 50 in the IC packaging structure 103. As shown in FIG. 3 and FIG. 4, the difference between the IC packaging structure 102 and the IC packaging structure in the first embodiment described above is that the heat dissipation structure 50 in the IC packaging structure 102 may include a first portion 50A disposed in the at least one trench TR and a second portion 50B disposed on a surface of the encapsulation material 40. In some embodiments, the first portion 50A may be directly connected with the second portion 50B. In some embodiments, the material composition of the second portion 50B may be identical to the material composition of the first portion 50A, such as the materials of the heat dissipation structure 50 described in the first embodiment, but not limited thereto. In some embodiments, the material composition of the second portion 50B may be different from the material composition of the first portion 50A. For example, as shown in FIG. 4, the second portion 50B of the heat dissipation structure 50 disposed on the top surface of the encapsulation material 40 may have an uneven surface for increasing the surface area of the second portion 50B and enhancing the cooling capacity of the heat dissipation structure 50. In some embodiments, a plurality of metal particles (not shown) may be used to form the uneven surface of the second portion 50B. In some embodiments, the first portion 50A of the heat dissipation structure 50 may include first metal particles (such as silver powders, not shown), the second portion 50B of the heat dissipation structure 50 may include second metal particles (not shown), and a dimension of each of the second metal particles may be larger than a dimension of each of the first metal particles because larger metal particles are required for forming the uneven surface of the second portion 50B, but not limited thereto. The roughness of the uneven surface of the second portion 50B may be controlled by adjusting the dimension of the metal particles used in the second portion 50B. In some embodiments, the uneven surface of the second portion 50B may also be formed by other suitable approaches. The thickness of the second portion 50B in the vertical direction Z may be about 0.01 millimeter or less than 0.01 millimeter, and the cooling capability of the IC packaging structure 102 may be further improved by the second portion 50B without increasing the size of the IC packaging structure 102 significantly.

Figure 5:
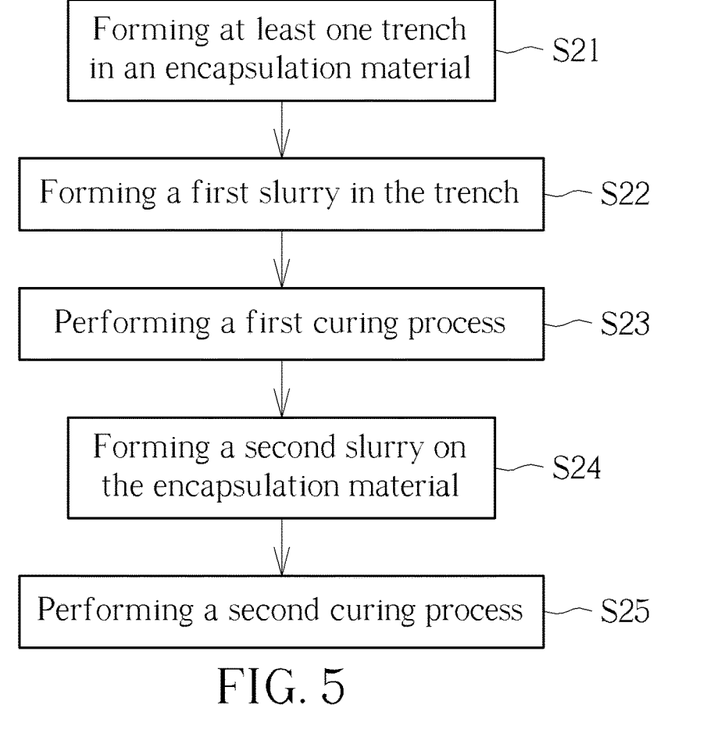
FIG. 5 is a flowchart of a manufacturing method of the IC packaging structure shown in FIG. 3 according to an embodiment of the present disclosure.
Figure 6:
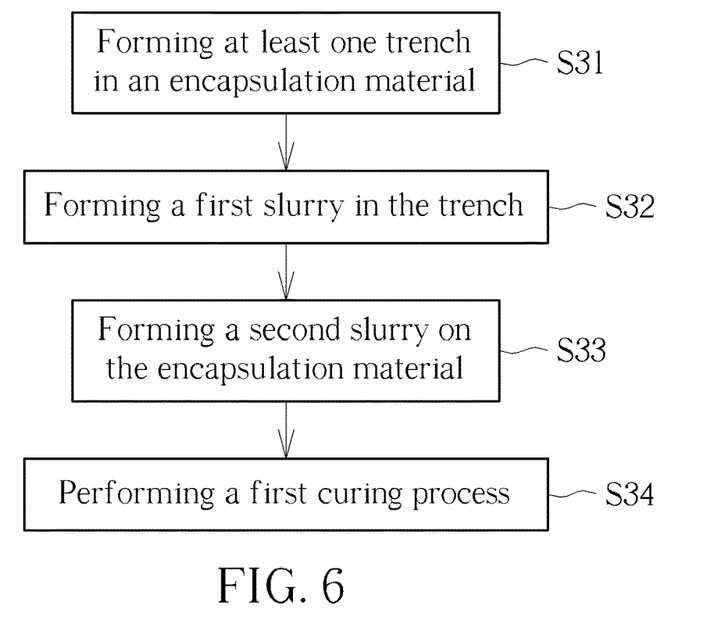
FIG. 6 is a flowchart of a manufacturing method of the IC packaging structure shown in FIG. 3 according to another embodiment of the present disclosure.
Figure 7:
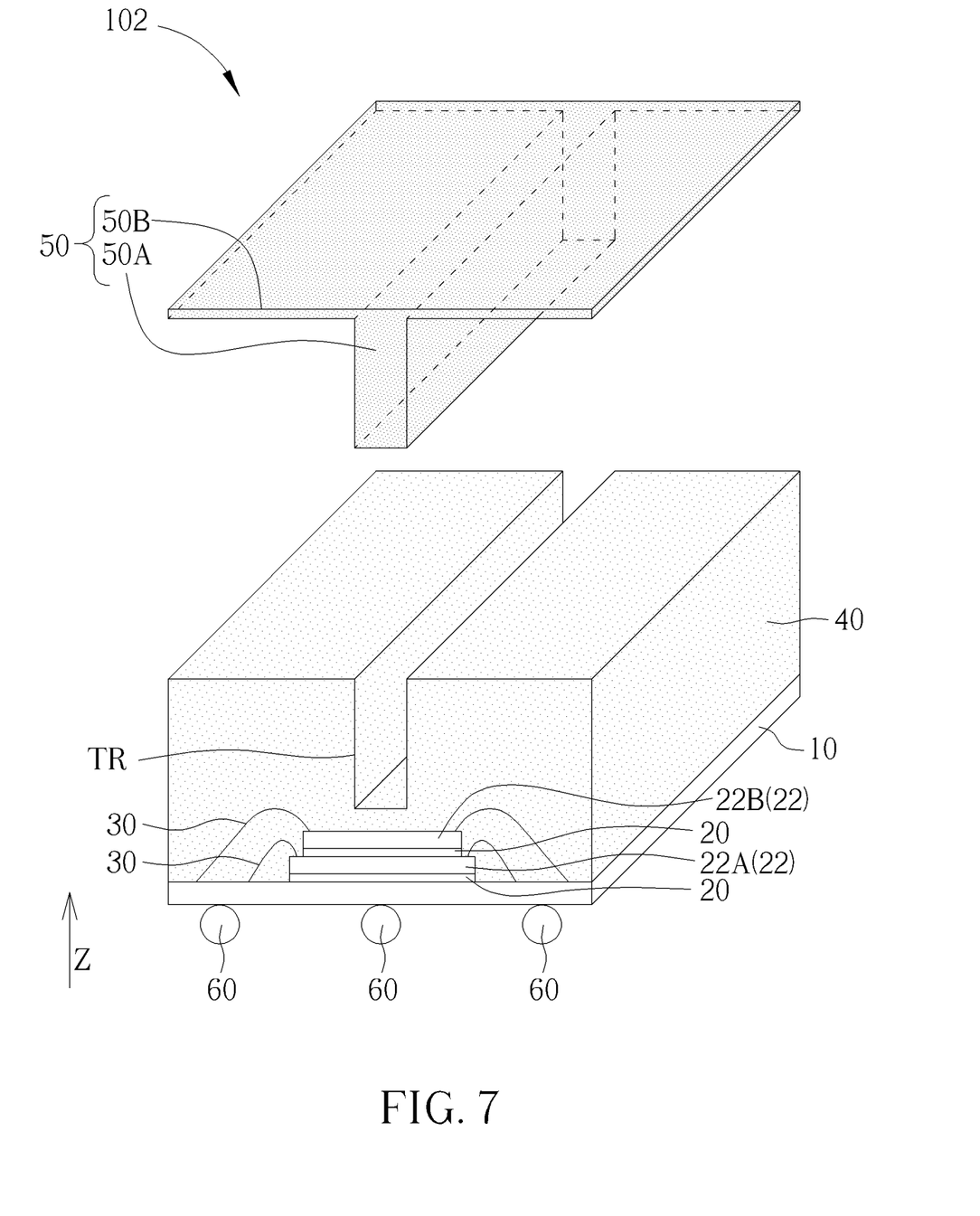
FIG. 7 is a schematic drawing illustrating a manufacturing method of the IC packaging structure shown in FIG. 3 according to further another embodiment of the present disclosure.

Please refer to FIGS. 5-7 and FIG. 3. FIG. 5 is a flowchart of a manufacturing method of the IC packaging structure 102 according to an embodiment of the present disclosure. FIG. 6 is a flowchart of a manufacturing method of the IC packaging structure 102 according to another embodiment of the present disclosure. FIG. 7 is a schematic drawing illustrating a manufacturing method of the IC packaging structure 102 according to further another embodiment of the present disclosure. As shown in FIG. 5 and FIG. 3, in some embodiments, a method of forming the heat dissipation structure 50 may include but is not limited to the following steps. In step S21, the at least one trench TR is formed in the encapsulation material 40. In step S22, the first slurry P1 may be formed in the at least one trench TR. Subsequently, in step S23, the first curing process is performed to the first slurry P1. The first slurry P1 may be cured and solidified by the first curing process to be the first portion 50A of the heat dissipation structure 50 in the trench TR. After the step of forming the first portion 50A of the heat dissipation structure 50, step S24 may be carried on to form a second slurry P2 on the surface of the encapsulation material 40. In other words, the second slurry P2 may be formed after the step of forming the first slurry P1 in the at least one trench TR and may be formed after the first curing process, but not limited thereto. Subsequently, in step S25, a second curing process may be performed to the second slurry P2 for forming the second portion 50B of the heat dissipation structure 50 on the surface of the encapsulation material 40.

In some embodiments, the second curing process may include a thermal curing process, an irradiation curing process, or other suitable curing approaches according to the curing requirements of the second slurry P2. The second slurry P2 may be cured and solidified to be the second portion 50B of the heat dissipation structure 50 on the surface of the encapsulation material 40. The second slurry P2 may be formed on the surface of the encapsulation material 40 by a spray coating process or other suitable approaches. In some embodiments, the material composition of the second slurry P2 may be identical to the material composition of the first slurry P1 described in the first embodiment. In some embodiments, the material composition of the second slurry P2 may be different from the material composition of the first slurry P1. For example, the first slurry P1 may include the first metal particles, the second slurry P2 may include the second metal particles, and the dimension of each of the second metal particles may be larger than the dimension of each of the first metal particles. In addition, the first slurry P1 and the second slurry P2 may be cured and solidified by the first curing process and the second curing process respectively, and the first curing process may be different from the second curing process especially when the material composition of the second slurry P2 may be different from the material composition of the first slurry P1, but not limited thereto. In some embodiments, the process condition of the second curing process may also be substantially identical to the process condition of the first curing process. Additionally, in some embodiments, the second slurry P2 may be further formed on side surfaces of the encapsulation material 40, and the second slurry P2 on the side surfaces of the encapsulation material 40 may be cured and solidified to be the second portion 50B of the heat dissipation structure 50 on the side surfaces of the encapsulation material 40.

As shown in FIG. 6 and FIG. 3, in some embodiments, a method of forming the heat dissipation structure 50 may include but is not limited to the following steps. In step S31, the at least one trench TR is formed in the encapsulation material 40. In step S32, the first slurry P1 may be formed in the at least one trench TR. Subsequently, in step S33, the second slurry P2 may be on the surface of the encapsulation material 40 and the first slurry P1. In step S34, the first curing process is performed to the first slurry P1 and the second slurry P2 for forming the first portion 50A and the second portion 50B of the heat dissipation structure 50 respectively. In other words, the second slurry P2 may be formed before the first curing process, and the second slurry P2 is cured and solidified by the first curing process to be the second portion 50B of the heat dissipation structure 50 on the surface of the encapsulation material 40.

As shown in FIG. 7 and FIG. 3, in some embodiments, the heat dissipation structure 50 including the first portion 50A and the second portion 50B connected to the first portion 50A may be formed by other suitable approaches (e.g. metal injection molding) independently and be combined with the encapsulation material 40 having the trench TR formed therein subsequently.

Figure 8:
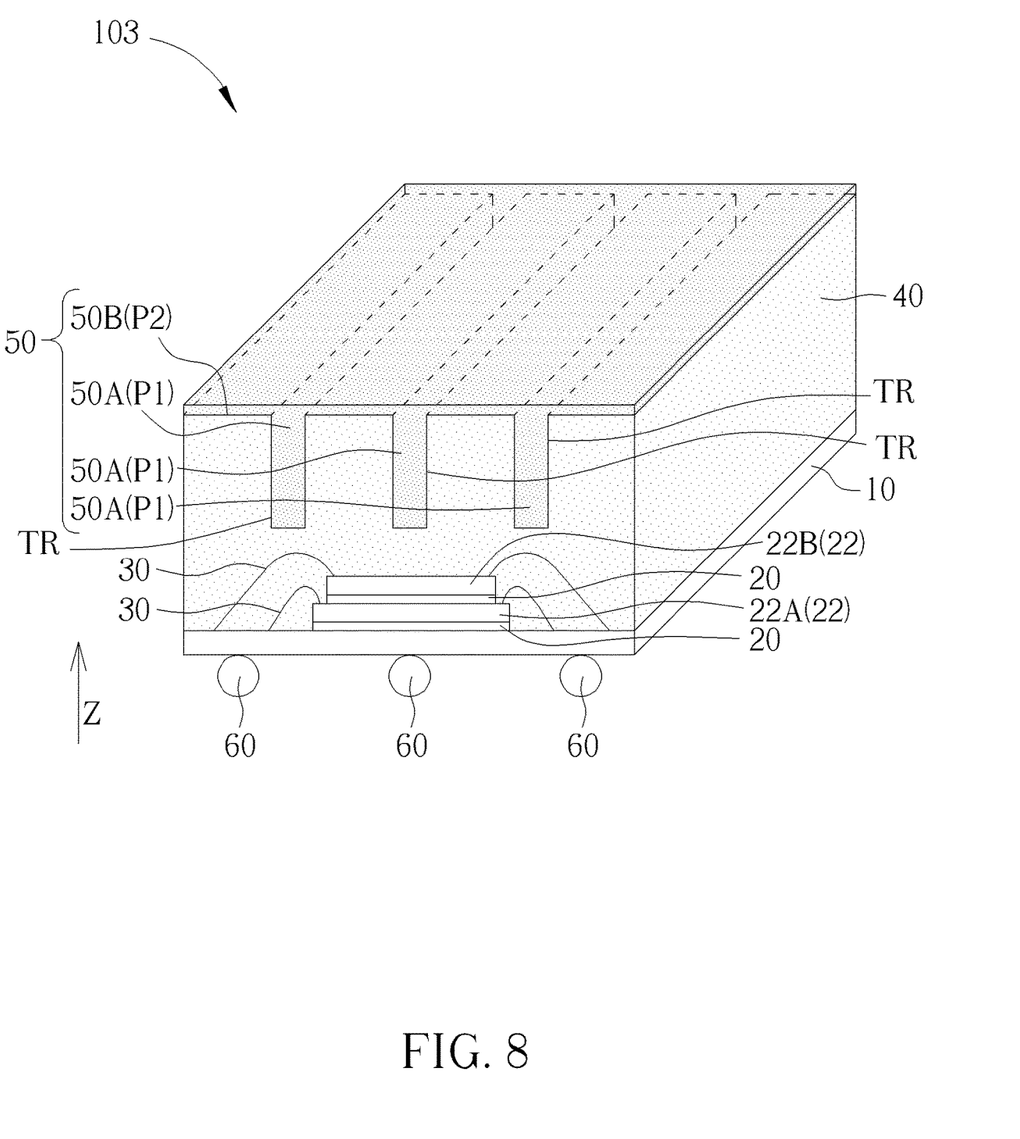
FIG. 8 is a schematic drawing illustrating an IC packaging structure according to a third embodiment of the present disclosure.
Figure 9:
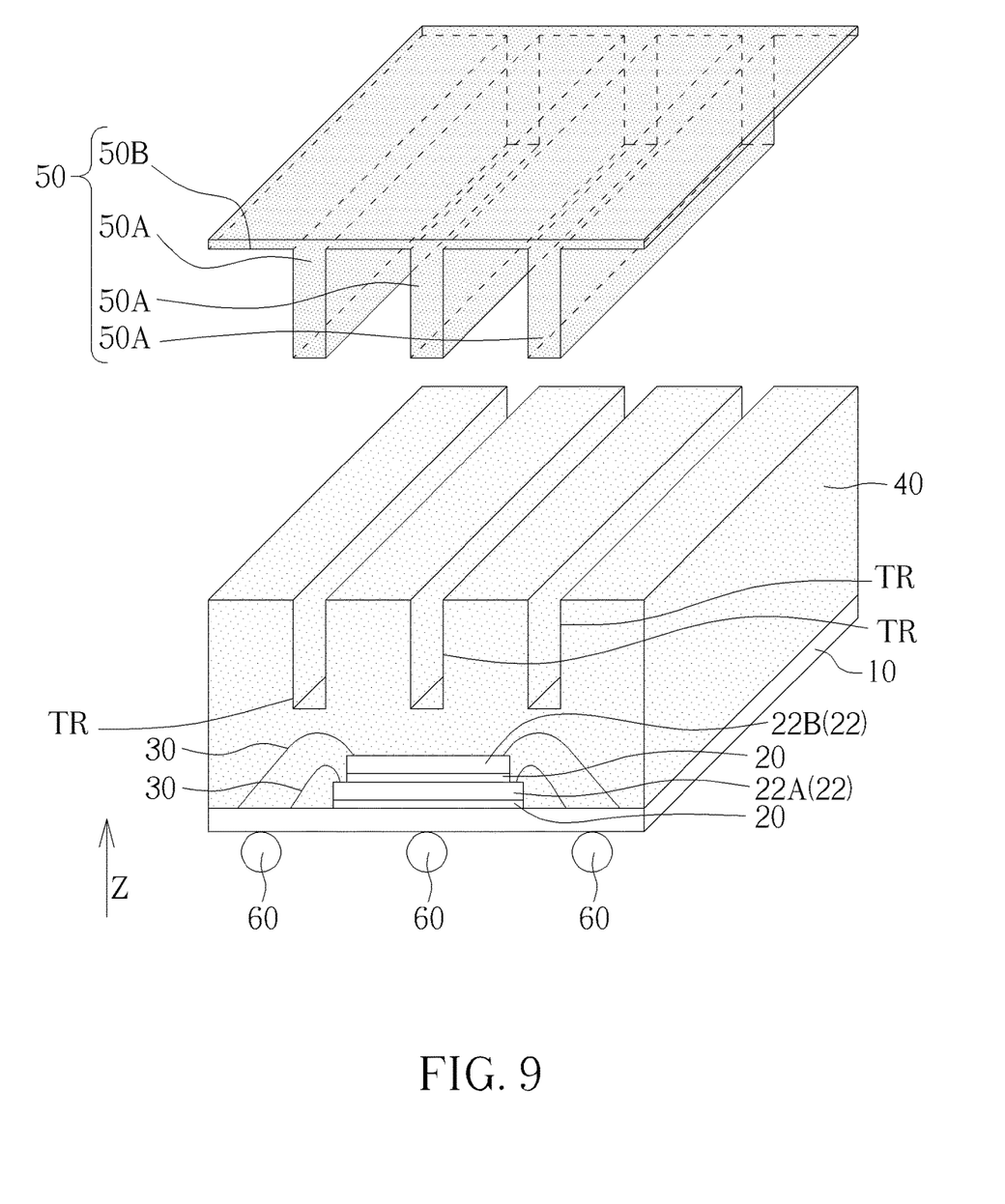
FIG. 9 is a schematic drawing illustrating a manufacturing method of the IC packaging structure shown in FIG. 8 according to an embodiment of the present disclosure.

Please refer to FIG. 8 and FIG. 9. FIG. 8 is a schematic drawing illustrating an IC packaging structure 103 according to a third embodiment of the present disclosure, and FIG. 9 is a schematic drawing illustrating a manufacturing method of the IC packaging structure 103 according to an embodiment of the present disclosure. As shown in FIG. 8, the difference between the IC packaging structure 103 and the IC packaging structure in the second embodiment described above is that more than one trench TR may be formed in the encapsulation material 40, and the heat dissipation structure 50 in the IC packaging structure 103 may include a plurality of first portions 50A disposed in the trenches TR respectively. The amount of the trenches TR, the shapes of the trenches TR, and/or the depth of each of the trenches TR may be further modified according to the heat distribution on the stacked dies 22 and/or the circuits in the packaging substrate 10. In some embodiments, the heat dissipation structure 50 in the IC packaging structure 103 may be formed by a method similar to the method shown in FIG. 5 or the method shown in FIG. 6 described above. In some embodiments, the heat dissipation structure 50 including the first portions 50A and the second portion 50B connected to the first portions 50A may be formed by other suitable approaches independently and be combined with the encapsulation material 40 having the trenches TR formed therein subsequently.

Figure 10:
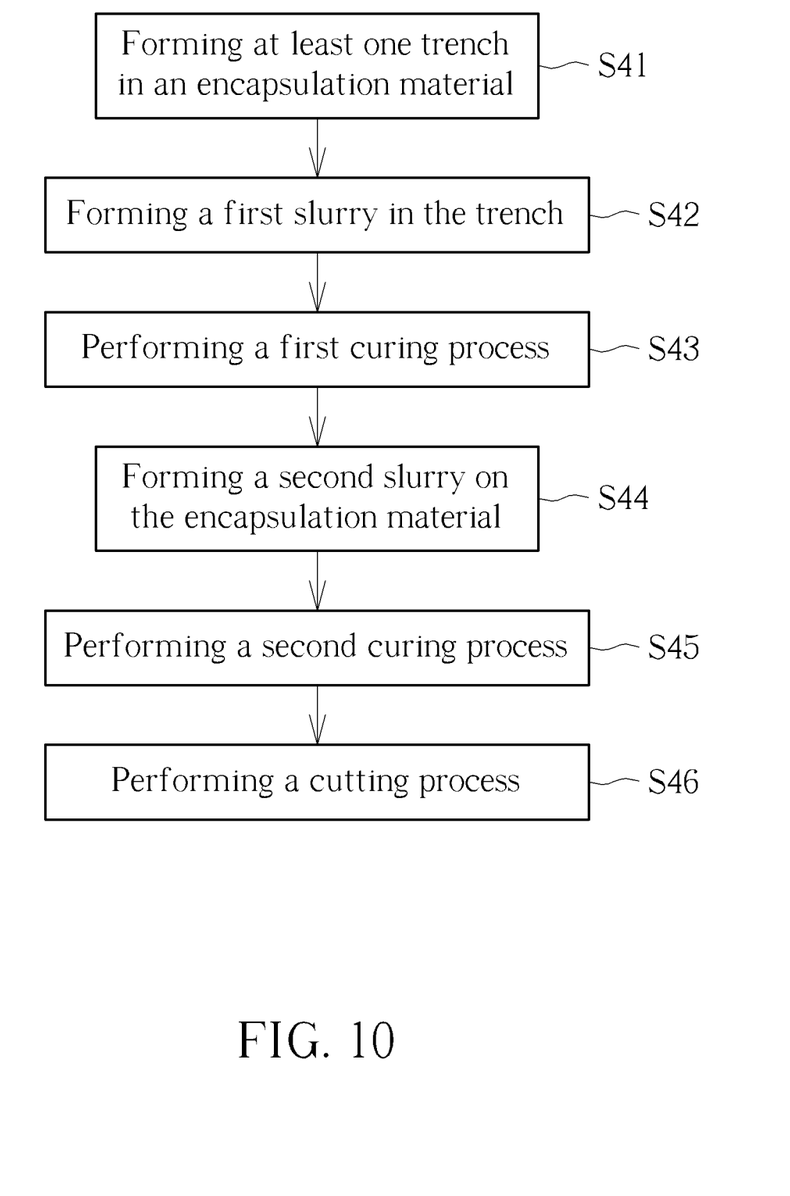
FIG. 10 is a flowchart of a manufacturing method of an IC packaging structure according to a fourth embodiment of the present disclosure.
Figure 11:
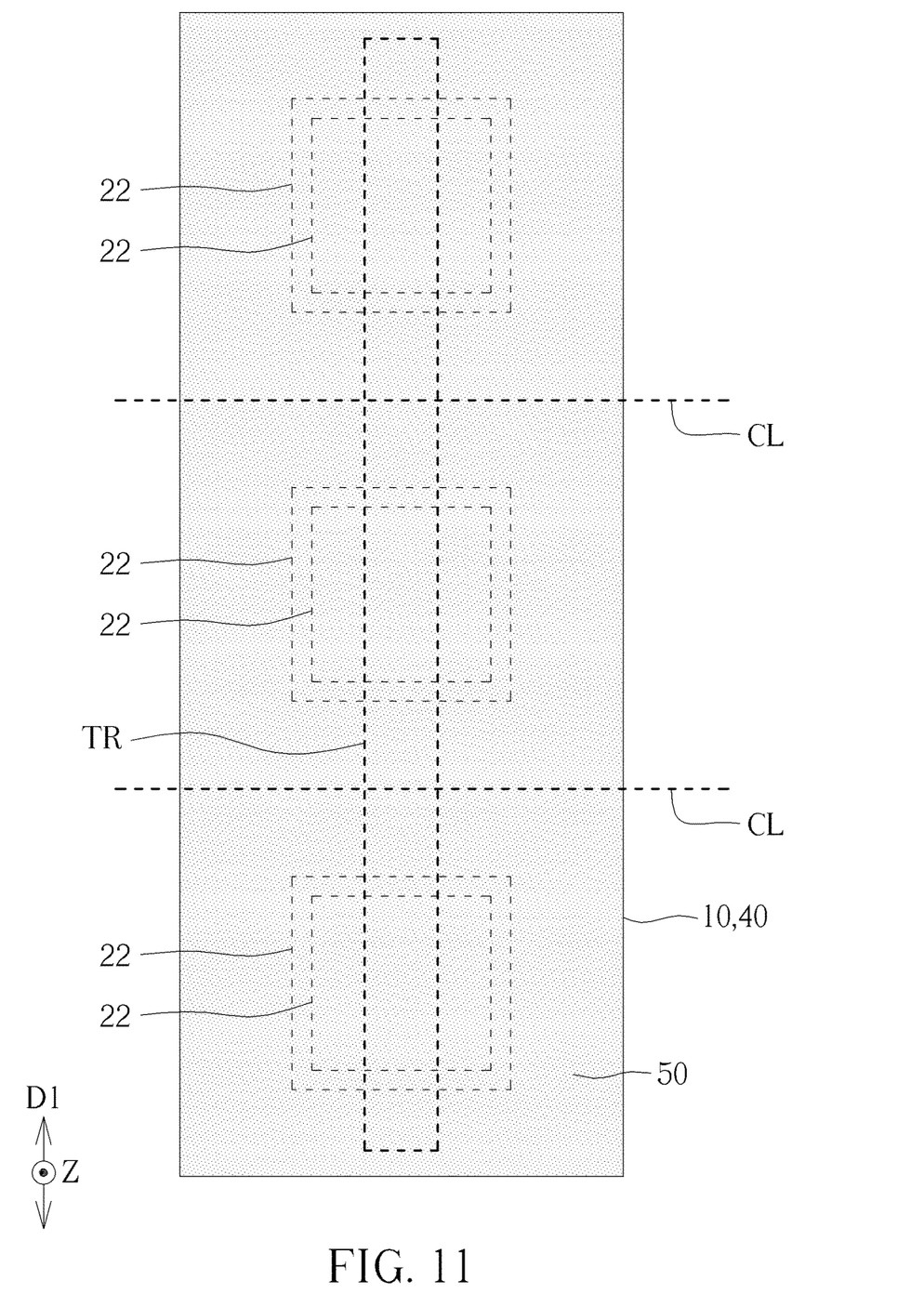
FIG. 11 is a schematic drawing illustrating the manufacturing method of the IC packaging structure according to the fourth embodiment of the present disclosure.

Please refer to FIG. 10, FIG. 11 and FIG. 3. FIG. 10 is a flowchart of a manufacturing method of an IC packaging structure according to a fourth embodiment of the present disclosure, and FIG. 11 is a schematic drawing illustrating the manufacturing method of the IC packaging structure in this embodiment. As shown in FIG. 10 and FIG. 11, the manufacturing method of the IC packaging structure may include the following steps. A plurality of dies 22 may be disposed on the packaging substrate 10. At least some of the dies 22 may be disposed separated from one another in a horizontal direction orthogonal to the vertical direction Z, and the horizontal direction (such as a first direction D1 shown in FIG. 11) may be parallel to the top surface of the packaging substrate 10, but not limited thereto. The encapsulation material 40 is formed on the packaging substrate 10 and encapsulates the dies 22 on the packaging substrate 10. Subsequently, in step S41, at least one trench TR is formed in the encapsulation material 40. In step S42, the first slurry is formed in the trench TR. In step S43, the first curing process is performed to the first slurry. In step S44, the second slurry is formed on the encapsulation material 40. In step S45, the second curing process is performed. The steps S41-S45 may be similar to the manufacturing method described in FIG. 5 and details of the steps S41-S45 will not be redundantly described. In some embodiments, the manufacturing method of the steps S41-S45 may be replaced by the manufacturing method described in FIG. 6. Subsequently, in step S46, a cutting process may be performed. In some embodiments, the cutting process may be performed along cutting lines CL for separating some of the dies on the packaging substrate 10, and the cutting process may be regarded as a singulation process, but not limited thereto. In some embodiments, the cutting process may be performed after the step of forming the heat dissipation structure 50, but not limited thereto. In some embodiment, the trench TR may be a straight line pattern elongated in the first direction D1, and the dies 22 arranged in the first direction D1 may be separated from one another by the cutting process. For example, three IC packaging structure 102 shown in FIG. 3 may be formed after performing the cutting process to the structure shown in FIG. 11, but not limited thereto. The projection shape of the trench TR in the vertical direction Z may be further modified according to the heat distribution on the dies 22 and/or the circuits in the packaging substrate 10.

Figure 12:
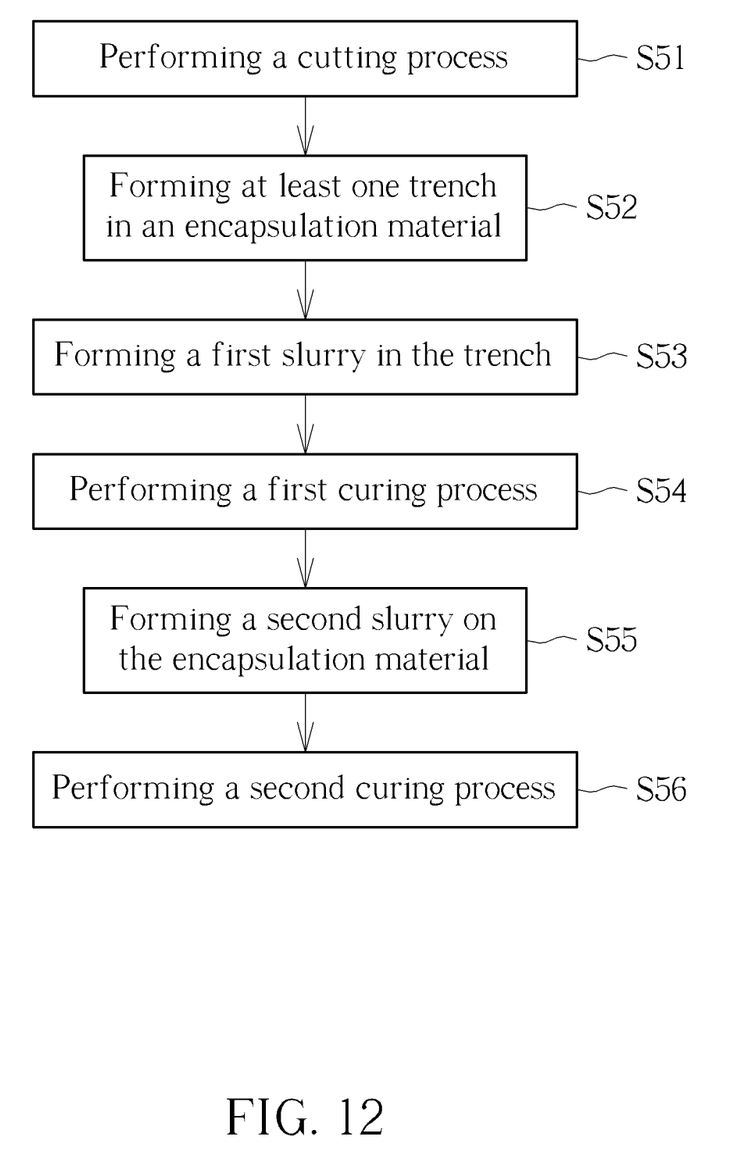
FIG. 12 is a flowchart of a manufacturing method of an IC packaging structure according to a fifth embodiment of the present disclosure.
Figure 13:
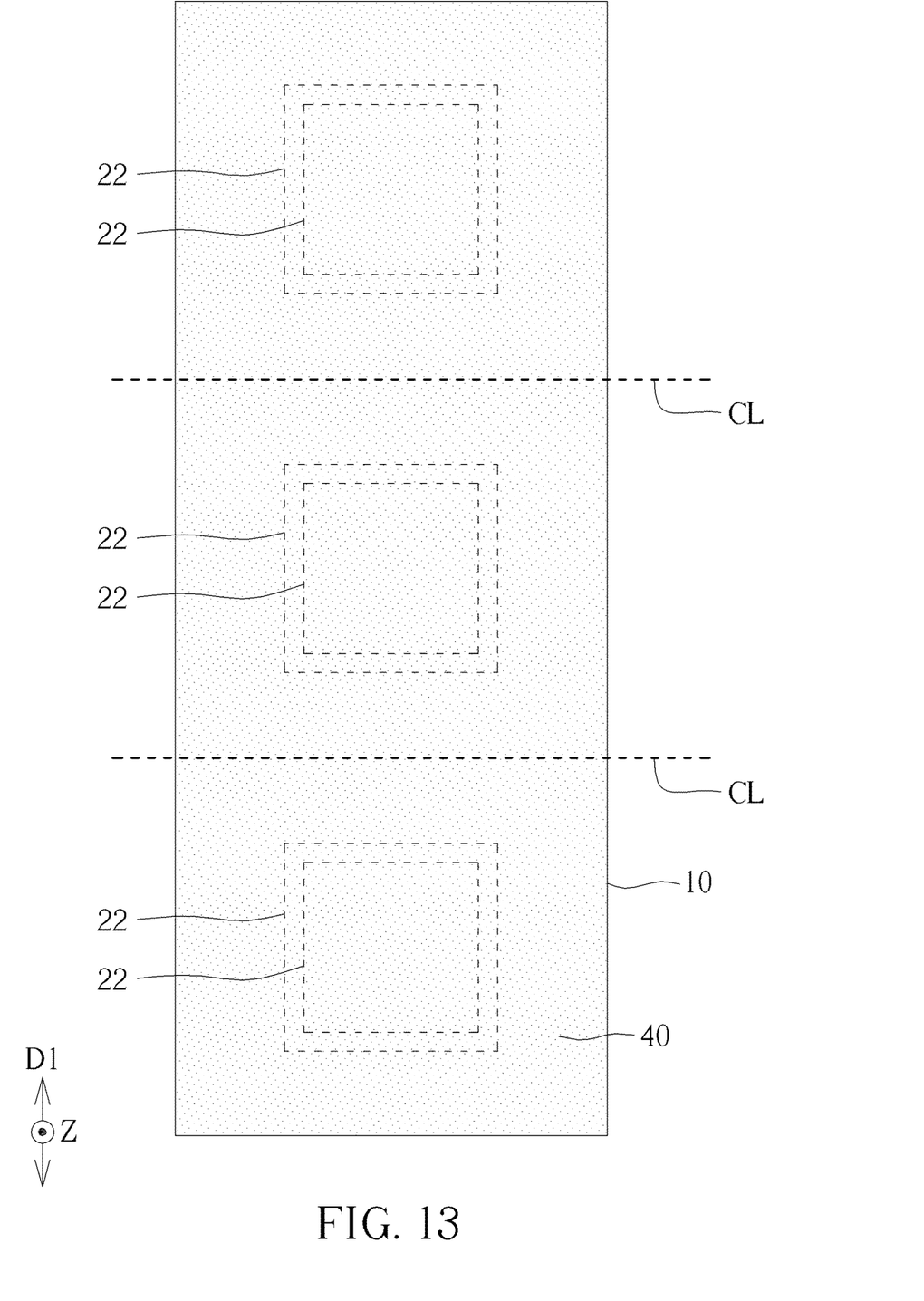
FIG. 13 is a schematic drawing illustrating the manufacturing method of the IC packaging structure according to the fifth embodiment of the present disclosure.

Please refer to FIG. 12, FIG. 13, and FIG. 3. FIG. 12 is a flowchart of a manufacturing method of an IC packaging structure according to a fifth embodiment of the present disclosure, and FIG. 13 is a schematic drawing illustrating the manufacturing method of the IC packaging structure in this embodiment. FIG. 3 may be regarded as a schematic drawing in a step subsequent to FIG. 13. As shown in FIG. 12 and FIG. 13, the manufacturing method of the IC packaging structure may include the following steps. A plurality of dies 22 may be disposed on the packaging substrate 10. The encapsulation material 40 is formed on the packaging substrate 10 and encapsulates the dies 22 on the packaging substrate 10. Subsequently, in step S51, the cutting process is performed. In some embodiments, the cutting process may be performed along cutting lines CL for separating some of the dies on the packaging substrate 10, and the cutting process may be regarded as a singulation process, but not limited thereto. As shown in FIG. 12, FIG. 13, and FIG. 3, in step S52, at least one trench TR is formed in the encapsulation material 40 after the cutting process. In step S53, the first slurry is formed in the trench TR. In step S54, the first curing process is performed to the first slurry. In step S55, the second slurry is formed on the encapsulation material 40. In step S56, the second curing process is performed. The steps S52-S56 may be similar to the manufacturing method described in FIG. 5 and details of the steps S52-S56 will not be redundantly described. In some embodiments, the manufacturing method of the steps S52-S56 may be replaced by the manufacturing method described in FIG. 6. In some embodiments, the cutting process may be performed after the step of forming the encapsulation material 40 and before the step of forming the at least one trench TR.

To summarize the above descriptions, in the IC packaging structure and the manufacturing method thereof according to the present disclosure, the heat dissipation structure is at least partially disposed in the trench formed in the encapsulation material for reducing the distance between the heat dissipation structure and the dies encapsulated by the encapsulation material. The cooling capability of the IC packaging structure may be improved accordingly without increasing the size of the IC packaging structure significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an integrated circuit (IC) packaging structure, comprising:
   disposing one or a plurality of dies on a packaging substrate;
   forming an encapsulation material on the packaging substrate, wherein the encapsulation material is configured to encapsulate the one or the plurality of the dies on the packaging substrate;
   forming at least one trench in the encapsulation material; and
   forming a heat dissipation structure on the encapsulation material, wherein at least a part of the heat dissipation structure is formed in the at least one trench, a part of the encapsulation material is located between the heat dissipation structure and the one or the plurality of the dies for isolating the heat dissipation structure from the one or the plurality of the dies, and the step of forming the heat dissipation structure comprises:
   forming a first slurry in the at least one trench;
   performing a first curing process to the first slurry for forming a first portion of the heat dissipation structure; and
   forming a second slurry on a surface of the encapsulation material after forming the first slurry in the at least one trench, wherein a material composition of the second slurry is different from a material composition of the first slurry, the first slurry comprises first metal particles, the second slurry comprises second metal particles, and a dimension of each of the second metal particles is larger than a dimension of each of the first metal particles for forming an uneven surface of the heat dissipation structure, wherein the uneven surface of the heat dissipation structure is a top surface facing away from the encapsulation material.

2. The manufacturing method of the IC packaging structure according to claim 1, wherein the step of forming the heat dissipation structure further comprises:
   performing a second curing process to the second slurry for forming a second portion of the heat dissipation structure on the surface of the encapsulation material, wherein the second slurry is formed after the first curing process.

3. The manufacturing method of the IC packaging structure according to claim 1, wherein the second slurry is formed before the first curing process, and the second slurry is cured by the first curing process to be a second portion of the heat dissipation structure on the surface of the encapsulation material.

4. The manufacturing method of the IC packaging structure according to claim 1, further comprising:
performing a cutting process after the step of forming the heat dissipation structure.

5. The manufacturing method of the IC packaging structure according to claim 1, further comprising:
performing a cutting process after the step of forming the encapsulation material and before the step of forming the at least one trench.

6. The manufacturing method of the IC packaging structure according to claim 1, wherein a heat transfer coefficient of the heat dissipation structure is higher than a heat transfer coefficient of the encapsulation material.

7. The manufacturing method of the IC packaging structure according to claim 2, wherein the second portion of the heat dissipation structure is formed outside the trench.

8. The manufacturing method of the IC packaging structure according to claim 2, wherein the second portion of the heat dissipation structure is formed on a topmost surface of the encapsulation material in a thickness direction of the packaging substrate.

9. The manufacturing method of the IC packaging structure according to claim 2, wherein the second curing process is different from the first curing process.

10. The manufacturing method of the IC packaging structure according to claim 1, wherein the one or the plurality of the dies are electrically connected to the packaging substrate.

11. The manufacturing method of the IC packaging structure according to claim 1, wherein the one or the plurality of the dies are electrically connected to the packaging substrate by a bonding wire.

12. The manufacturing method of the IC packaging structure according to claim 11, wherein the bonding wire comprises an aluminum wire, a copper wire, a silver wire, or a gold wire.

13. The manufacturing method of the IC packaging structure according to claim 11, wherein the one or the plurality of the dies are disposed on a first surface of the packaging substrate, connection structures are disposed on a second surface of the packaging substrate, and the second surface is opposite to the first surface in a thickness direction of the packaging substrate.

14. The manufacturing method of the IC packaging structure according to claim 13, wherein the one or the plurality of the dies are electrically connected to the connection structures via the bonding wire and the packaging substrate.

15. The manufacturing method of the IC packaging structure according to claim 13, wherein the connection structures are solder balls.

16. The manufacturing method of the IC packaging structure according to claim 1, wherein the first metal particles are silver powders.

17. The manufacturing method of the IC packaging structure according to claim 1, wherein the packaging substrate is a plastic substrate.

18. The manufacturing method of the IC packaging structure according to claim 1, wherein the packaging substrate comprises an epoxy substrate, or a bismaleimide triazine (BT) resin substrate.

19. The manufacturing method of the IC packaging structure according to claim 1, wherein the encapsulation material comprises a plastic material.

20. The manufacturing method of the IC packaging structure according to claim 1, wherein the encapsulation material comprises an epoxy molding compound (EMC).

* * * * *